Figure 3:
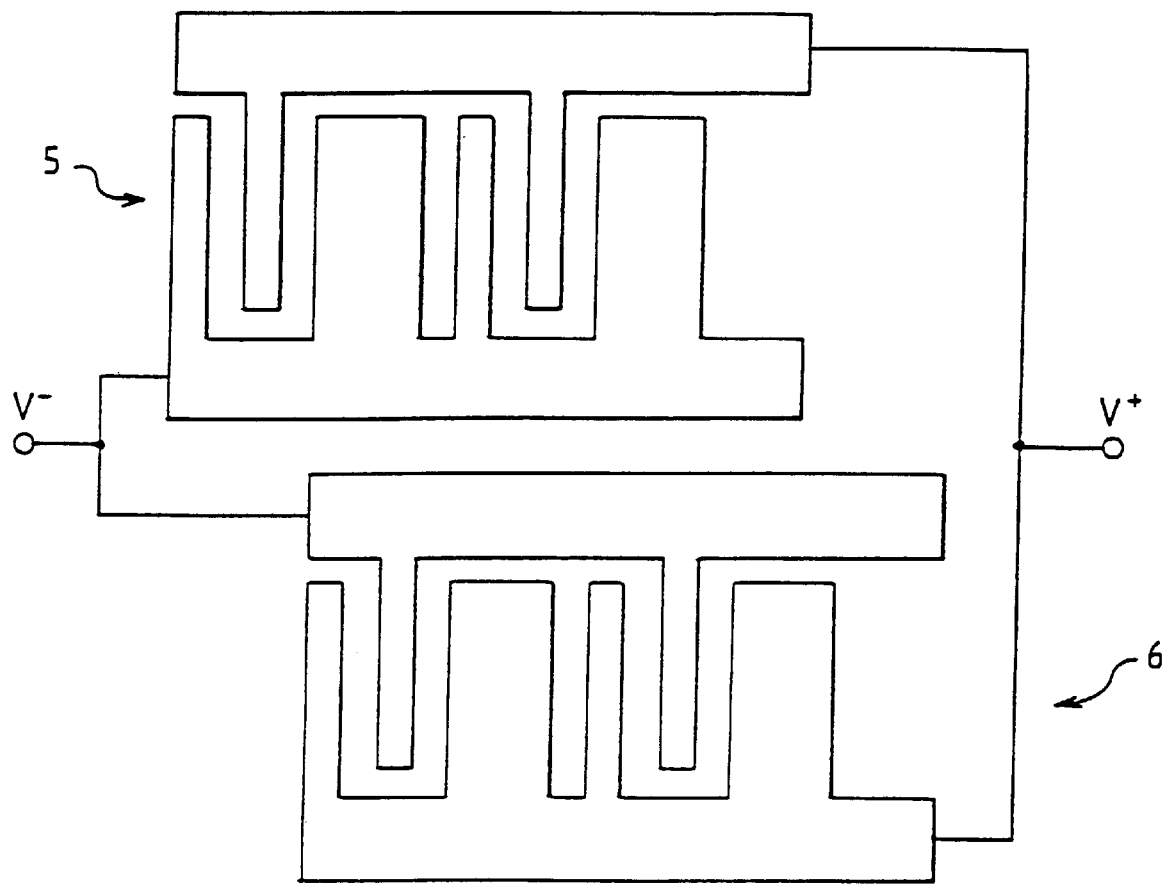

United States Patent [19]
Dufilie et al.

[11] Patent Number: 6,011,344
[45] Date of Patent: Jan. 4, 2000

[54] SURFACE ACOUSTIC WAVE TRANSDUCER DRIVEN IN DIFFERENTIAL MODE

[75] Inventors: Pierre Dufilie, Vernon, Conn.; Marc Solal, Antibes, France

[73] Assignee: Thomson-CSF, Paris, France

[21] Appl. No.: 09/068,122

[22] PCT Filed: Oct. 31, 1996

[86] PCT No.: PCT/FR96/01717

§ 371 Date: Jun. 4, 1998

§ 102(e) Date: Jun. 4, 1998

[87] PCT Pub. No.: WO97/17756

PCT Pub. Date: May 15, 1997

[30] Foreign Application Priority Data

Nov. 7, 1995 [FR] France ................................ 95 13132

[51] Int. Cl.[7] .............................. H01L 41/04; H03H 9/00
[52] U.S. Cl. .................... 310/313 B; 310/313 R; 333/150; 333/154
[58] Field of Search ...................... 310/313 R, 313 B; 333/150, 154

[56] References Cited

U.S. PATENT DOCUMENTS

| | | | |
|---|---|---|---|
| 4,081,769 | 3/1978 | Shreve | 333/195 |
| 4,405,874 | 9/1983 | Suthers | 310/313 B |
| 4,491,757 | 1/1985 | Hartmann | 310/313 B |
| 5,020,034 | 5/1991 | Solal et al. | 367/138 |
| 5,475,348 | 12/1995 | Hode et al. | 333/195 |
| 5,663,696 | 9/1997 | Morgan | 333/194 |
| 5,703,427 | 12/1997 | Solal et al. | 310/313 D |

Primary Examiner—Clayton LaBalle
Assistant Examiner—Peter Medley
Attorney, Agent, or Firm—Oblon, Spivak, McClelland, Maier & Neustadt, P.C.

[57] ABSTRACT

The transducer according to the invention, driven in differential mode, consists of at least a first transducer (5) and a second transducer (6) which are connected in parallel so as to obtain the symmetry of the differential inputs, respectively forming a first and a second acoustic channel; the two transducers (5, 6) exhibiting a specified longitudinal offset with respect to one another. Applications: mobile radio filters.

2 Claims, 5 Drawing Sheets

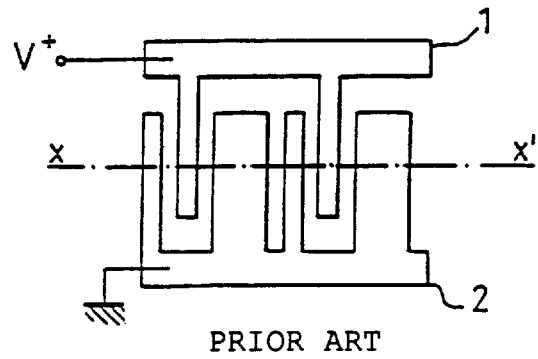
PRIOR ART
FIG.1a
PRIOR ART
FIG.1b
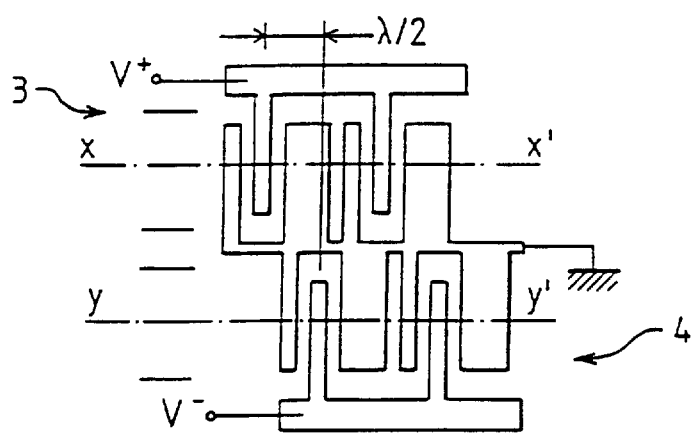
FIG.2a
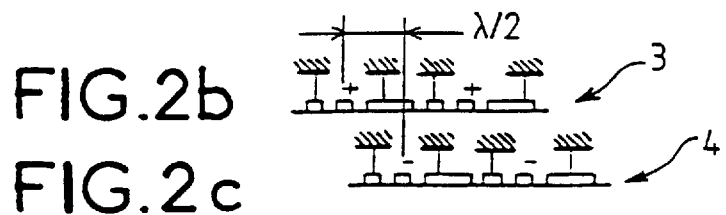
FIG.2b
FIG.2c

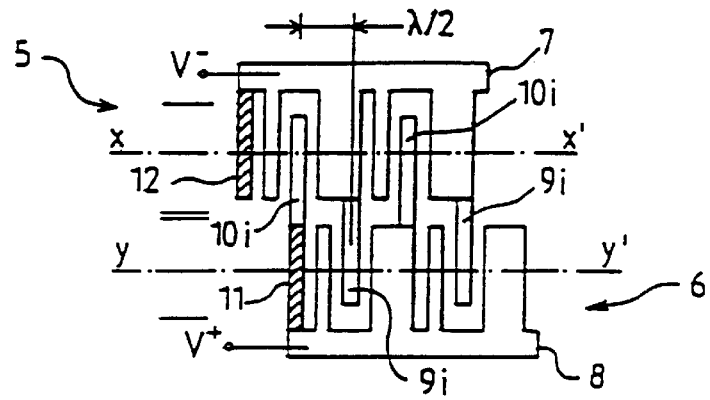
FIG. 4a
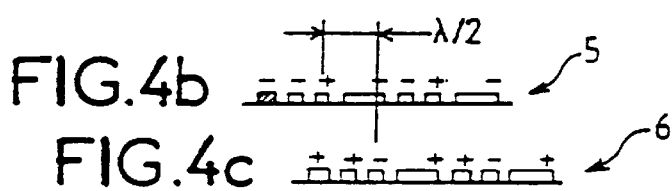
FIG. 4b
FIG. 4c
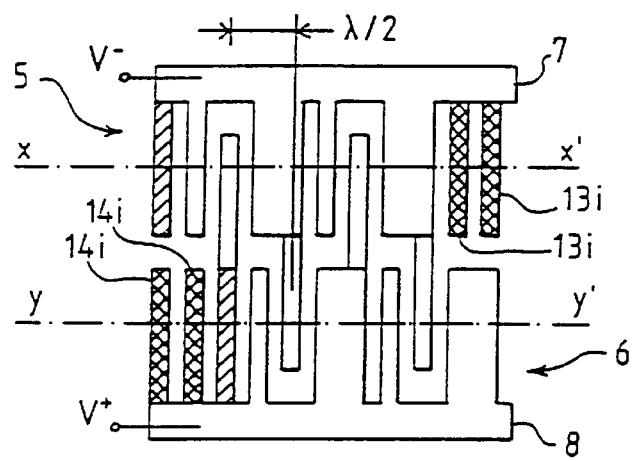
FIG. 5a
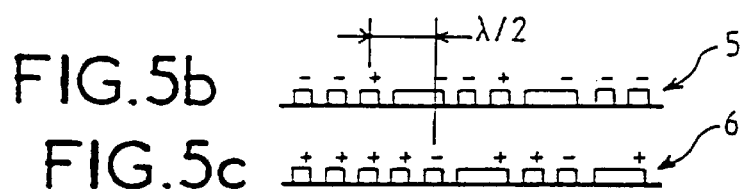
FIG. 5b
FIG. 5c

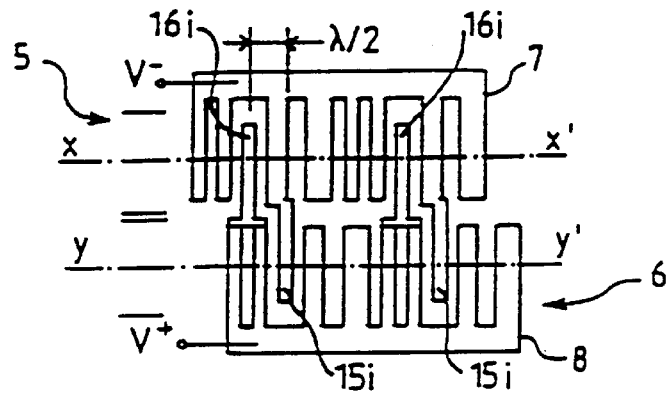
FIG. 6a
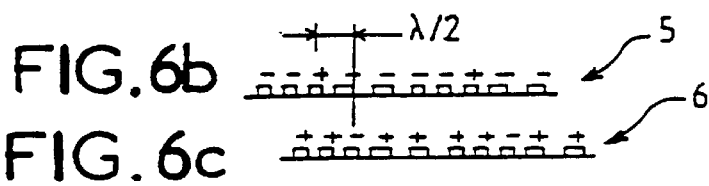
FIG. 6b
FIG. 6c
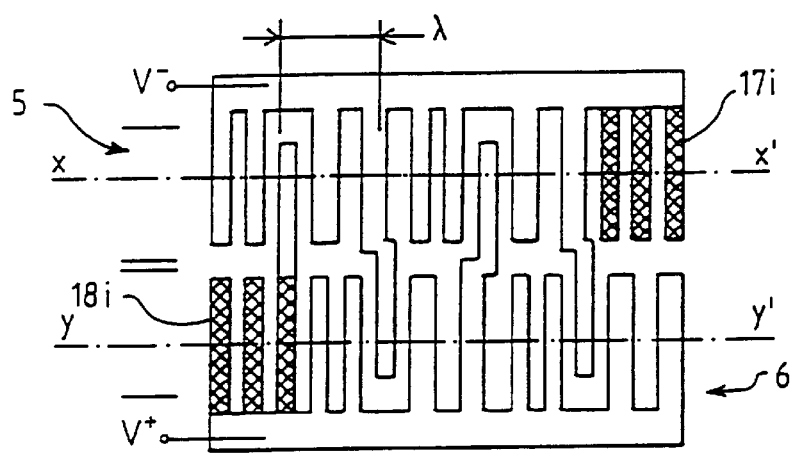
FIG. 7a
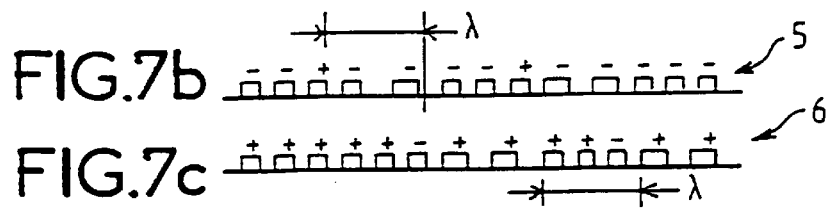
FIG. 7b
FIG. 7c

1

SURFACE ACOUSTIC WAVE TRANSDUCER DRIVEN IN DIFFERENTIAL MODE

The present invention relates to a surface acoustic wave transducer, especially a surface acoustic wave distributed acoustic reflection transducer known as a DART, driven in differential mode and having low-impedance inputs/outputs. There is a growing demand for this type of drive, especially in view of the advances in integrated circuits.

The basic structure of a DART being assumed to be known, it will therefore not be described in detail in the present description.

To drive a transducer in differential mode it is necessary to use a structure having symmetrical differential inputs. The basic structure of DARTs does not allow them to be used directly in differential mode. This is because the reflector of the DART constitutes an asymmetry between the connection pads linked respectively to the differential inputs.

Transducers and filters using these transducers can be applied in many fields such as radars or mobile radiocommunication systems, in particular for filtering the intermediate frequencies.

A DART structure with differential inputs is known, described in particular in patent No. 92 10966 entitled "Transducteur d'ondes unidirectionnel [Unidirectional wave transducer]", filed by the Applicant on Sep. 15, 1992 and published as U.S. Pat. No. 2,695,771. This structure allows differential feed between a positive and negative source, referenced with respect to earth, and includes two emitter cells which are linked to the positive source and flank a third emitter cell linked to the negative source, and these three cells are separated by a first and a second reflective cell and possibly linked to earth, these cells naturally being taken to earth potential by symmetry. This configuration uses a maze structure in which the earthed electrodes are interposed between those linked to the positive source and those linked to the negative source. This maze poses a problem of sampling and of high impedance as seen by the inputs/outputs of the structure.

The objective of the present invention is to overcome the aforementioned drawbacks.

To this end, the subject of the invention is a surface acoustic wave transducer driven in differential mode, characterized in that it consists of at least a first transducer and a second transducer which are connected in parallel so as to obtain the symmetry of the differential inputs, respectively forming a first and a second acoustic channel; the two transducers exhibiting a specified longitudinal offset with respect to one another.

The advantage of the structure of the transducer according to the invention is that it presents low impedances to the inputs/outputs of this structure in respect of a structure with two parallel acoustic channels driven in differential mode.

Figure 8:
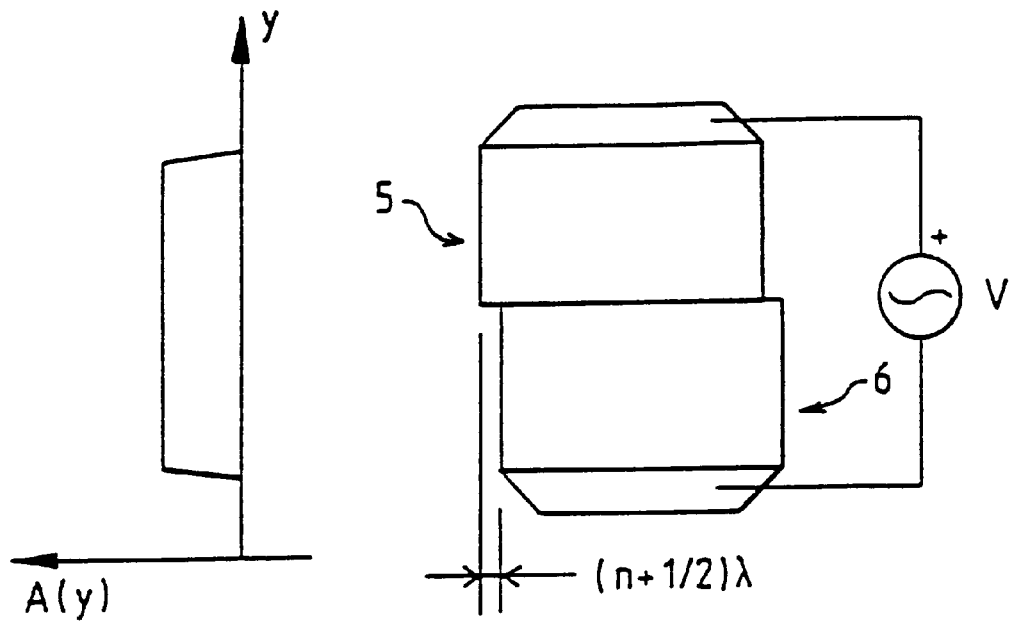
Figure 9:
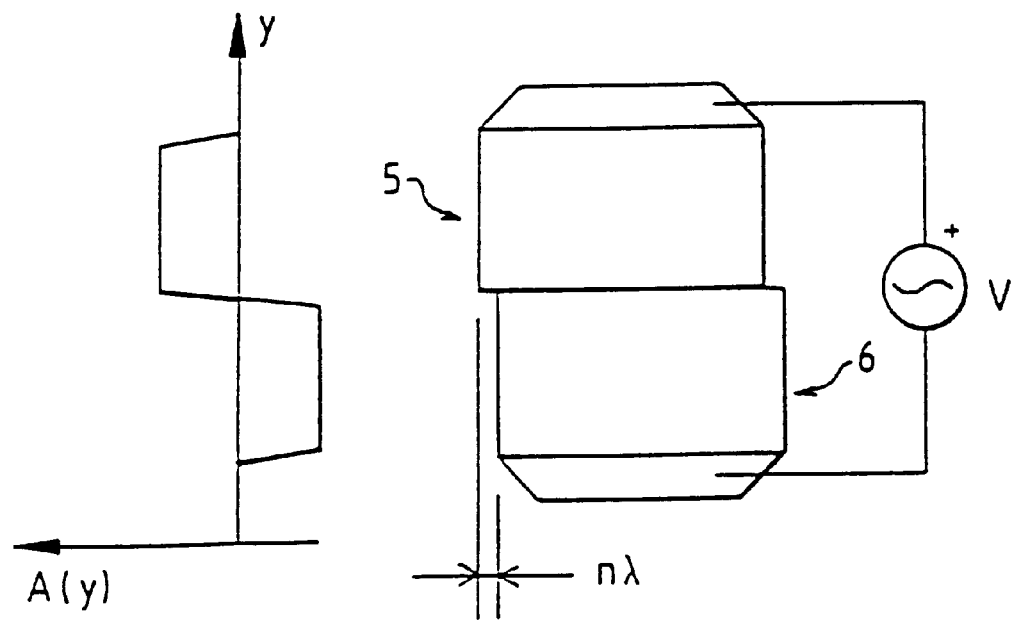

Other characteristics and advantages of the present invention will be clearly understood on reading the description which follows and the appended figures which represent:

FIGS. 1a and 1b, a known example of a structure of a transducer of DART type with non-differential inputs viewed from above and in section respectively, FIGS. 2a, 2b and 2c, an embodiment of a transducer comprising two transducers connected in series to form a transducer with differential inputs viewed from above and in section respectively, FIG. 3, a first structure of a transducer according to the invention with two transducers in parallel, driven in differential mode and longitudinally offset, FIGS. 4a, 4b and 4c, a second structure of a transducer according to the invention comprising two transducers connected in parallel, driven in differential mode and offset by $\lambda/2$, and their respective sectional view, FIGS. 5a, 5b and 5c, a third structure of a transducer according to the invention comprising two transducers connected in parallel, driven in differential mode and offset by $\lambda/2$, and their respective sectional view, FIGS. 6a, 6b and 6c, a fourth structure of a transducer according to the invention comprising two transducers connected in parallel, driven in differential mode and offset by $\lambda/2$, and their respective sectional view, FIGS. 7a, 7b and 7c, a fifth structure of a transducer according to the invention comprising two transducers connected in parallel, driven in differential mode and offset by $\lambda$, and their respective sectional view, FIG. 8, a representation of a transducer according to the invention, offset by an even number of a half wavelength, and the shape of the symmetric acoustic wave generated by the transducer, and FIG. 9; a representation of a transducer according to the invention, offset by an odd number of a half wavelength, and the shape of the antisymmetric acoustic wave generated by the transducer.

In these figures, corresponding elements are designated with the same labels.

FIGS. 1a and 1b illustrate an example of a known structure of a DART with non-differential inputs. It consists of a first electrode 1 and a second electrode 2, each including a specified number of fingers. The first electrode 1 is linked to a positive potential $V^+$ and the second to a reference potential, for example earth; each electrode 1, 2 including a connection pad making it possible to apply a specified potential to each finger of the electrode. Each of the electrodes thus forms a comb and some of the fingers of these two electrodes are interleaved to form emitter cells and acoustic reflector cells. The acoustic signal is generated wherever a difference of electrical potential is present.

FIG. 1b represents a sectional view, along an axis xx', of the structure illustrated in FIG. 1a. In this sectional view may be seen the various fingers of the two electrodes which are deposited on the surface of a piezoelectric substrate (not represented). The potential of these fingers has also been represented.

A transducer with differential inputs can easily be constructed from two transducers with non-differential inputs starting from this basic structure with non-differential drive, and from the structure described in particular in French patent No. 91 12882, filed on Oct. 10, 1991 by the Applicant and entitled "Filtre à ondes de surface et à trajet acoustique replié [Surface wave filter with folded acoustic path]", published as U.S. Pat. No. 2,682,833. To do this, two transducers, identical to that of FIGS. 1a and 1b, are connected in series. The respective earthed connection pads of each of the two transducers are common. These two transducers respectively form two acoustic channels. These two acoustic channels can appear as a single channel by offsetting the two channels horizontally by $\lambda/2$, $\lambda$ being the wavelength corresponding to the central frequency of operation of the transducer.

Such a structure is illustrated in FIG. 2a. The electrical connections are symmetric with respect to earth, thus giving the same impedance as seen between each differential input $V^+$ and $V^-$, referenced with respect to earth.

FIGS. 2b and 2c respectively represent a sectional view along an axis xx' and yy', of the first and of the second transducers 3 and 4. As in the representation of FIG. 1b, the various potentials are indicated above each finger corresponding to the electrodes linked, via their respective connection pads, to the differential inputs.

A major drawback of such a structure is that the impedance as seen between the differential inputs is equal to four times that of a structure with non-differential inputs having the same aperture as that used by the two channels.

A first structure of a transducer according to the invention making it possible to reduce these impedances is illustrated in FIG. 3.

In this structure, the two transducers already described in the structure illustrated in FIG. 2a are connected in parallel rather than in series. Each of the transducers 5 and 6 is wired directly between the differential inputs $V^+$ and $V^-$, the reference potential (earth) no longer being present. The symmetry of the two pathways is restored by reversing the polarities on the two DARTs. This reversal of polarity can be compensated for in a simple way by offsetting the two transducers 5 and 6 by an odd number of half wavelengths, thus making it possible to obtain a symmetric wavefront. However, this is not compulsory and it might be quite acceptable to generate an antisymmetric wavefront, the device and for example the receiving transducer having to be designed accordingly. This leads to the impedances as seen between each differential input being almost equal to those as seen between the non-differential inputs of a transducer with an aperture equal to the sum of the apertures of the two acoustic channels. A factor of four has been gained as compared with the initial series-connected structure.

In a second structure of a transducer according to the invention, illustrated in FIG. 4a, the wiring to the differential inputs, equivalent to the wiring of the previous structure, uses only the two connection pads of two electrodes 7 and 8, each connection pad being wired respectively to one of the two differential inputs $V^+$ and $V^-$, and by linking the fingers 9i and 10i being linked together in such a way that the same sequence of polarity on the various electrodes is complied with on each channel.

A first acoustic channel is formed from the first electrode 7 connected to a first differential input V– via its connection pad. This electrode 7 includes a specified number of fingers of specified widths at specified positions along the electrode 7. A second channel is formed from a second electrode 8, likewise comb-shaped, including the same number of fingers as the first electrode 7 and connected via its connection pad to the other differential input V+. The same specified number of fingers 9i and 10i belonging respectively to the two electrodes 7 and 8 are interleaved with the other fingers of the electrodes 7 and 8. A feature of this structure lies in the fact that the specified number of fingers 9i of the first electrode 7 belongs to the second acoustic channel, and that the same specified number of fingers 10i of the second electrode 8 belongs to the first acoustic channel. The sectional views of FIGS. 4b and 4c demonstrate the way in which the various potentials are distributed over each finger, for the first transducer 7 along a section axis xx' and for the second transducer 8 along a section axis yy' respectively.

The transducer according to the invention utilizes the fact that an acoustic wave is generated by a potential difference applied between two adjacent fingers rather than by an absolute potential.

The sectional views of FIGS. 4b and 4c when compared respectively with those of FIGS. 2b and 2c show that the potential difference between two adjacent fingers of FIGS. 4a, 4b, 4c is twice that measured between two adjacent fingers of FIGS. 2a, 2b, 2c. This is due to the fact that the connection to the reference potential (earth) has been dispensed with. Thus, as illustrated in FIG. 4a, two fingers having the same polarity in the two channels are connected. The fingers 9i and 10i of the electrodes 7 and 8 which are interleaved with the other fingers are made by extending other fingers as is the case for the first electrode, or by extending a first finger 11, hatched in the figure, which is added to allow connection to the potential V+ of the second electrode 8. A second finger 12, hatched, of the first electrode 7 has likewise been added to the first acoustic channel so as to preserve the same number of fingers in each of the channels. This ensures the same impedance as seen between the differential inputs V+ and V– and hence ensures the symmetry of the impedances of the transducer.

As illustrated in FIG. 5a, it is possible to add two fingers 13i and 14i respectively to the two opposite ends of the two channels. This makes it possible to align the ends of the two channels while preserving the same number of identical fingers for the two channels. The sectional views of FIGS. 5b and 5c demonstrate the way in which the various potentials are distributed over each finger, for the first transducer 7 along a section axis xx' and for the second transducer 8 along a section axis yy' respectively.

This structure still operates if more fingers are added to one channel than to the other, however the difference between the numbers of fingers of the two channels must remain small enough not to modify significantly the capacitances of the differential inputs with respect to earth.

With regard to these same impedances, a comparison between the structures of FIGS. 2a and 4a reveals that the impedance of the structure of FIG. 4a is approximately four times smaller than that of FIG. 2a. This is due to the fact that the structure of FIG. 2a is made by the series-connecting of the two transducers 3 and 4 referenced with respect to a reference potential, earth. The potential difference between the various polarities of the structure of FIG. 4a is twice that of the structure of FIG. 2.

The $\lambda/2$ offset of the first transducer 5 with respect to the second transducer 6 makes it possible to obtain a zero phase shift between the two channels at the central frequency f0. Moreover, this phase shift makes it possible to obtain a zero at the frequency 2f0 and hence to eliminate the second harmonic.

Although the offsetting of the two transducers 5 and 6 is not essential, it is nevertheless important since it makes it possible to solve a connectional problem.

FIGS. 6a, 6b, 6c illustrate an application of a transducer according to the invention to a DART differential structure using sources with a period of $\lambda/3$ and fingers of width $\lambda/6$. In this structure, the interleaved fingers 15i and 16i do not lie directly along the extension of a preexisting finger of the electrode 7 and 8. In particular, with regard to the fingers 16i belonging to the electrode 8 linked to the positive differential input V+, these fingers 16i, in respect of an electrical connection problem, are attached to the end of two adjacent fingers of the same electrode 8 which are slightly lengthened to allow electrical connection of the interleaved finger 16i with the potential $V^+$.

The two transducers 7 and 8 being, as in the structure of FIG. 4a, offset by $\lambda/2$, the interleaved fingers 15i of the first electrode 7 undergo an offset of $\lambda/2$ with respect to the interleaved fingers 16i of the second electrode 8.

The interleaved fingers 15i of the first electrode 7 are offset with respect to the other fingers of the electrode 7 supporting them which are likewise lengthened to provide for electrical connection with the potential V–.

In FIGS. 7a, 7b and 7c another structure of a transducer according to the invention is illustrated.

In this structure, there is an offset of λ between each transducer 5 and 6. This structure being similar in part to the structure of FIGS. 6a, 6b and 6c, it will therefore not be redescribed.

In order to comply with an identical number of fingers for each of the channels, three fingers 17i and 18i, hatched in the figure, are added respectively to the two opposite ends of the two channels.

FIGS. 8 and 9 respectively illustrate the two types of offsets allowed by a transducer according to the invention.

In FIG. 8, the offset between the two acoustic channels is an odd multiple of λ/2 such as 3λ/2, for example. This can be used to obtain extra zeros in the transfer function of the transducer. The acoustic wave A(y) generated is symmetric since the acoustic waves of the two channels are in phase.

In FIG. 9, the offset between the two acoustic channels is an even multiple of λ/2 such as, for example, 0 or λ. The acoustic wave A(y) generated is then antisymmetric.

It is possible to use two different transducers on the two acoustic channels as long as the impedances in the band of use and the capacitances remain of the same order of magnitude.

The present invention is not limited to the specific structures just described. Any other structure implementing the main characteristic of the invention, namely the placing in parallel of two transducers exhibiting an asymmetry in their two connection pads so as to allow them to operate in differential mode.

We claim:

1. Transducer characterized in that the transducer (5, 6) of each channel is of the DART type.

2. A surface acoustic wave transducer including a first and second channel structure driven in a differential mode by a first and second different input respectively, each of said first and second channels including a first transducer having a first and second plurality of fingers, each of said first and second plurality of fingers being linked to one of said first and second differential inputs, wherein said first and second plurality of fingers produces, for each of said first and second channels, a succession of widths of fingers which is identical for each of said first and second channels but is offset from the first channel to the second channel by a distance which is a multiple of λ/2 and wherein said first and second plurality of fingers of said first and second channels respectively provide a succession of electrical polarities which is identical or opposite for the first and second channels to within a value which is an offset of a multiple of λ/2, and wherein the transducer of the first channel has a single connection pad linked to the first differential input and the transducer of the second channel has a single connection pad linked to the second differential input, and wherein the second plurality of fingers of one of said first and second channels has an opposite polarity to the connection pad of said one channel and are linked to the connection pad of the other one of said first and second channels via said first plurality of fingers of said other channel.

* * * * *

UNITED STATES PATENT AND TRADEMARK OFFICE
CERTIFICATE OF CORRECTION

PATENT NO. : 6,011,344
DATED : January 4, 2000
INVENTOR(S) : Pierre DUFILIE ET AL.

It is certified that error appears in the above-identified patent and that said Letters Patent is hereby corrected as shown below:

Column 6, line 2, change "1." to --2.--; same line, after "Transducer" (first occurrence) insert --according to claim 1--.

Column 6, line 4, change "2." to --1.--.

Signed and Sealed this

Twenty-ninth Day of May, 2001

*Attest:*

NICHOLAS P. GODICI

*Attesting Officer*     *Acting Director of the United States Patent and Trademark Office*